(12) United States Patent
Bjorkman

(10) Patent No.: US 7,458,335 B1
(45) Date of Patent: *Dec. 2, 2008

(54) UNIFORM MAGNETICALLY ENHANCED REACTIVE ION ETCHING USING NESTED ELECTROMAGNETIC COILS

(75) Inventor: Claes H. Bjorkman, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 703 days.

This patent is subject to a terminal disclaimer.

(21) Appl. No.: 10/269,129

(22) Filed: Oct. 10, 2002

(51) Int. Cl.
*H01L 21/306* (2006.01)
*C23C 16/00* (2006.01)

(52) U.S. Cl. ............... 118/723 R; 118/723 MR; 118/723 MA; 118/723 I; 118/723 E; 156/345.42; 156/345.46; 156/345.49

(58) Field of Classification Search .......... 118/723 MR, 118/723 MA, 723 AN, 723 R, 723 I, 723 IR, 118/723 ER; 156/345.1, 345.42, 345.46, 156/345.49; 204/298.16, 298.17, 298.18, 204/298.19, 298.2, 298.21, 298.22; 315/111.41
See application file for complete search history.

(56) References Cited

U.S. PATENT DOCUMENTS

| | | | |
|---|---|---|---|
| 4,526,643 A | 7/1985 | Okano et al. .............. 156/345 |
| 4,552,639 A | 11/1985 | Garrett ..................... 204/298 |
| 4,600,492 A | 7/1986 | Ooshio et al. .............. 204/298 |
| 4,631,106 A | 12/1986 | Nakazato et al. ........... 156/345 |
| 4,668,338 A | 5/1987 | Maydan et al. ............. 156/643 |
| 4,668,365 A | 5/1987 | Foster et al. ............ 204/192.23 |
| 4,740,268 A | 4/1988 | Bukhman ................... 156/643 |
| 4,829,215 A | 5/1989 | Kim et al. .............. 315/111.41 |
| 4,842,683 A | 6/1989 | Cheng et al. ............... 156/345 |
| 4,919,783 A | 4/1990 | Asamaki et al. ......... 204/298.16 |
| 4,950,956 A | 8/1990 | Asamaki et al. ......... 315/111.21 |
| 4,963,242 A * | 10/1990 | Sato et al. .............. 204/298.31 |
| 5,032,202 A | 7/1991 | Tsai et al. ................. 156/345 |
| 5,061,838 A | 10/1991 | Lane et al. .............. 219/121.59 |
| 5,079,481 A | 1/1992 | Moslehi ................. 315/111.41 |
| 5,081,398 A | 1/1992 | Asmussen et al. ....... 315/111.41 |
| 5,087,857 A | 2/1992 | Ahn ..................... 315/111.21 |
| 5,122,251 A | 6/1992 | Campbell et al. ....... 204/298.06 |
| 5,208,512 A | 5/1993 | Forster et al. .......... 315/111.41 |
| 5,211,825 A | 5/1993 | Saito et al. ............. 204/192.32 |
| 5,215,619 A | 6/1993 | Cheng et al. ............... 156/345 |

(Continued)

FOREIGN PATENT DOCUMENTS

WO WO 2004/022238 A2 3/2004

*Primary Examiner*—Luz L. Alejandro
(74) *Attorney, Agent, or Firm*—Mayer & Williams PC

(57) ABSTRACT

A magnetic field-enhanced plasma reactor is disclosed, comprising a reaction chamber for applying a plasma to a substrate, a plurality of primary electromagnets disposed about said reaction chamber, and a plurality of secondary electromagnets. At least two of the primary electromagnets are adjacent to each other, and each of these primary electromagnets has at least one secondary electromagnet disposed within a region defined by a right rectangular prism having the largest perimeter that fits within the outer perimeter of the primary magnet. Typically, at least one of the secondary electromagnets in one of the at least two adjacent primary electromagnets is itself adjacent to a secondary electromagnet disposed in the other of the at least two adjacent primary electromagnets. This arrangement is found to eliminate non-uniformities observed at regions of the substrate which are disposed closest to the vertices formed by the adjacent primary electromagnets.

24 Claims, 10 Drawing Sheets

U.S. PATENT DOCUMENTS

| | | | |
|---|---|---|---|
| 5,225,024 A | 7/1993 | Hanley et al. | 156/345 |
| 5,252,194 A | 10/1993 | Demaray et al. | 204/298.2 |
| 5,304,279 A | 4/1994 | Coultas et al. | 156/345 |
| 5,308,417 A | 5/1994 | Groechel et al. | 156/643 |
| 5,444,207 A | 8/1995 | Sekine et al. | 219/121.43 |
| 5,449,977 A | 9/1995 | Nakagawa et al. | 315/111.51 |
| 5,519,373 A | 5/1996 | Miyata | 335/306 |
| 5,534,108 A | 7/1996 | Qian et al. | 156/643.1 |
| 5,659,276 A | 8/1997 | Miyata | 335/209 |
| 5,674,321 A | 10/1997 | Pu et al. | 118/723 MR |
| 5,717,294 A | 2/1998 | Sakai et al. | 315/111.41 |
| 5,718,795 A | 2/1998 | Plavidal et al. | 156/345 |
| 5,783,102 A | 7/1998 | Keller | 216/68 |
| 5,798,029 A | 8/1998 | Morita | 204/298.16 |
| 5,855,725 A | 1/1999 | Sakai | 156/345 |
| 5,876,576 A | 3/1999 | Fu | 204/298.2 |
| 5,902,461 A | 5/1999 | Xu et al. | 204/192.12 |
| 5,907,220 A | 5/1999 | Tepman et al. | 315/111.41 |
| 5,946,008 A | 8/1999 | Nishizawa et al. | 216/71 |
| 6,014,943 A | 1/2000 | Arami et al. | 118/723 E |
| 6,015,476 A | 1/2000 | Schlueter et al. | 156/345 |
| 6,030,486 A | 2/2000 | Loewenhardt et al. | 156/345 |
| 6,051,151 A | 4/2000 | Keller et al. | 216/68 |
| 6,063,236 A | 5/2000 | Sakai | 156/345 |
| 6,085,688 A | 7/2000 | Lymberopoulos et al. | 118/723 I |
| 6,113,731 A | 9/2000 | Shan et al. | 156/345 |
| 6,143,140 A | 11/2000 | Wang et al. | 204/192.12 |
| 6,164,240 A | 12/2000 | Nikulin | 118/723 I |
| 6,190,495 B1 | 2/2001 | Kubota et al. | 156/345 |
| 6,228,235 B1 | 5/2001 | Tepman et al. | 204/298.2 |
| 6,247,425 B1 | 6/2001 | Lymberopoulos et al. | 118/723 I |
| 6,251,242 B1 | 6/2001 | Fu et al. | 204/298.19 |
| 6,255,220 B1 | 7/2001 | Kisakibaru et al. | 438/707 |
| 6,274,008 B1 | 8/2001 | Gopalraja et al. | 204/192.17 |
| 6,277,249 B1 | 8/2001 | Gopalraja et al. | 204/192.12 |
| 6,296,747 B1 | 10/2001 | Tanaka | 204/298.07 |
| 6,300,227 B1 | 10/2001 | Liu et al. | 438/513 |
| 6,376,388 B1 | 4/2002 | Hashimoto et al. | 438/728 |
| 6,382,129 B1 | 5/2002 | Nikulin | 118/723 I |
| 6,436,230 B1 | 8/2002 | Kondo et al. | 156/345.46 |
| 6,444,104 B2 | 9/2002 | Gopalraja et al. | 204/298.13 |
| 6,451,177 B1 | 9/2002 | Gopalraja et al. | 204/192.12 |
| 6,485,617 B2 | 11/2002 | Fu et al. | 204/192.12 |
| 6,485,618 B2 | 11/2002 | Gopalraja et al. | 204/192.17 |
| 6,488,807 B1 | 12/2002 | Toshima et al. | 156/345 |
| 6,491,801 B1 | 12/2002 | Gung | 204/298.2 |
| 6,495,009 B1 | 12/2002 | Gung | 204/298.2 |
| 6,521,082 B1 | 2/2003 | Barnes et al. | 156/345.46 |
| 6,528,751 B1 | 3/2003 | Hoffman et al. | 219/121.43 |
| 6,545,580 B2 | 4/2003 | Hegde et al. | 335/296 |
| 6,579,421 B1 | 6/2003 | Fu | 204/192.12 |
| 6,599,399 B2 | 7/2003 | Xu et al. | 204/192.12 |
| 6,610,184 B2 | 8/2003 | Ding et al. | 204/298.17 |
| 6,613,689 B2 | 9/2003 | Liu et al. | 438/712 |
| 6,627,050 B2 | 9/2003 | Miller et al. | |
| 6,663,754 B2 | 12/2003 | Gung | |
| 6,673,199 B1 | 1/2004 | Yamartino | |
| 6,716,302 B2 | 4/2004 | Carducci et al. | |
| 6,761,804 B2 | 7/2004 | Perrin | 204/192.12 |
| 6,764,575 B1 | 7/2004 | Yamasaki et al. | 156/345.46 |
| 6,787,006 B2 | 9/2004 | Gopalraja et al. | 204/192.3 |
| 6,797,639 B2 | 9/2004 | Carducci et al. | 438/710 |
| 6,805,770 B1 | 10/2004 | Oster | 156/345.42 |
| 6,937,127 B2 | 8/2005 | Oster | 335/296 |
| 7,316,199 B2 * | 1/2008 | Horioka et al. | 118/723 R |
| 7,374,636 B2 * | 5/2008 | Horioka et al. | 156/345.46 |
| 2003/0006008 A1 * | 1/2003 | Horioka et al. | 156/345.46 |
| 2003/0085000 A1 * | 5/2003 | Horioka et al. | 156/345.49 |
| 2004/0182516 A1 | 9/2004 | Lindley et al. | 156/345.46 |
| 2004/0233027 A1 | 11/2004 | Oster | 335/306 |
| 2005/0167051 A1 | 8/2005 | Hoffman et al. | 156/345.46 |

* cited by examiner

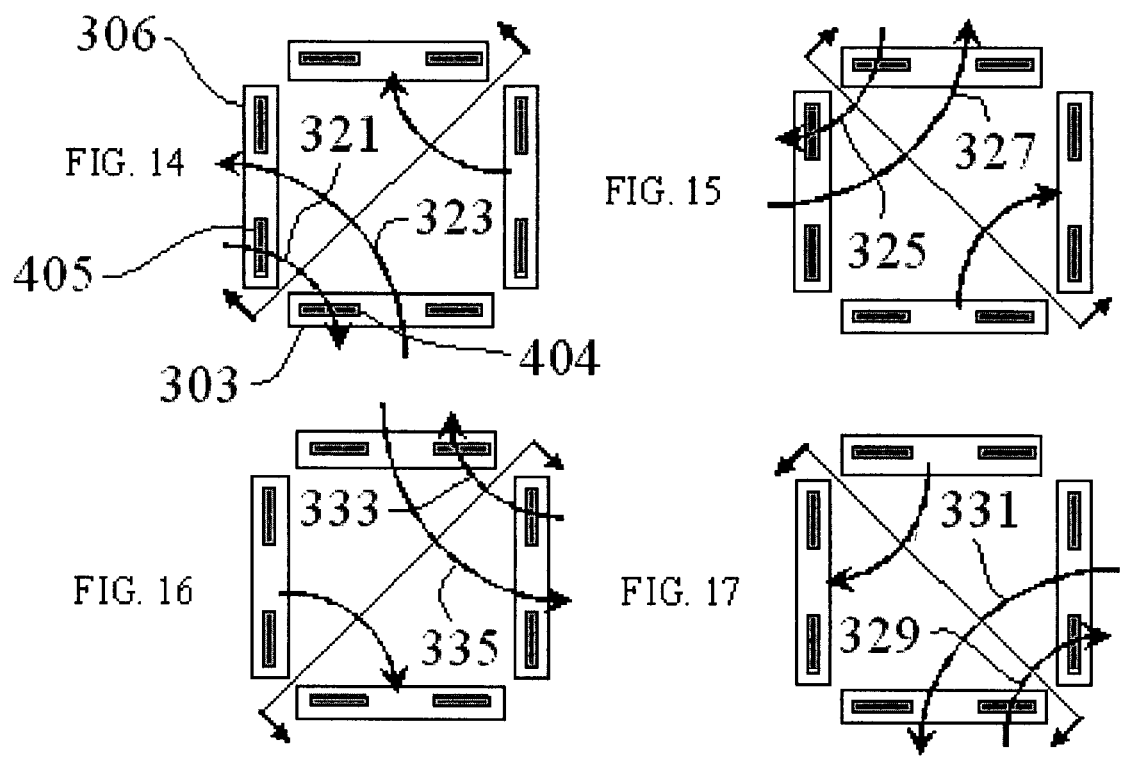

UNIFORM MAGNETICALLY ENHANCED REACTIVE ION ETCHING USING NESTED ELECTROMAGNETIC COILS

FIELD OF THE INVENTION

The present invention relates to a magnetic field-enhanced plasma etch reactor and, more particularly, to a method and apparatus for creating greater plasma uniformity in a magnetic field-enhanced plasma reactor that results in a reduction in plasma-induced charging damage to semiconductor devices.

BACKGROUND OF THE INVENTION

Magnetic field-enhanced plasma etch reactors for the plasma etching of a substrate are well known in the art. The use of plasma-based reactor processes has become widespread throughout the semiconductor industry, due in part to the ability of these devices to provide precisely controlled thin-film depositions and etches.

A plasma reactor typically comprises a reaction chamber supplied with a reactant gas, a pair of spaced-apart electrodes (a cathode and an anode) that utilize radio frequency (Rf) energy to generate an electric field within the chamber and thereby ionize the gas, and a substrate support which is adapted to support a substrate within the electric field. The cathode is typically embedded in the substrate support, and the anode is typically positioned over the substrate.

When the electric field ionizes the reactant gas, a plasma is produced which is a mixture of electrons, cations and anions. In operation, the positively charged cations are pushed outward by mutual repulsion toward the surfaces of the reaction chamber and are electrically attracted toward the cathode. As a result the substrate, which is supported just above the cathode, is bombarded by positively charged ions. Depending upon the composition of the plasma, this can result in either the formation of a deposited layer on the substrate, or can result in the substrate material being etched.

A magnetic field is generated within the reaction chamber to control the motion of the electrons within the plasma, and to restrict free electrons to a bulk plasma region located centrally in the reaction chamber. Typically, the magnetic field is generated through the use of one or more electromagnets that are positioned about the circumference of the reaction chamber. The magnetic field so generated is perpendicular to the electric field within the chamber and parallel to the surface of the cathode. In particular, the magnetic field is oriented perpendicular to the electric field within a cathode plasma sheath proximate to the surface of the cathode. This orientation of the magnetic field confines a substantial quantity of electrons to a region within the plasma around the cathode plasma sheath, thereby increasing the plasma density near the cathode sheath and the substrate. Absent corrective measures, an uneven distribution of plasma density results due to a phenomenon referred to as E×B drift. Since the plasma is not uniform in density, etch rates experienced by a substrate exposed to the plasma are found to vary across the substrate, such that regions exposed to the greatest plasma density experience the highest etch rates. E×B drift, and the factors giving rise to it, are discussed in greater detail in U.S. Pat. No. 6,113,731 (Shan et al.), and the directional effect of this phenomenon is illustrated with respect to FIGS. 1A and 1B of that reference.

In addition to causing variations in etch rates across the surface of a substrate, E×B drift also results in the spatially non-uniform accumulation of electrical charge on the substrate. The differential in electrical charge produces voltages and current flow between different points on the wafer, a condition referred to as "charge up". If the voltage across any of the dielectric structures fabricated on the wafer exceeds the maximum safe voltage of that structure, then the structure may be damaged by the current flowing through it.

Various techniques have evolved in the art in an attempt to compensate for E×B drift and/or to avoid charge-up. The goal of many of these techniques is to promote greater uniformity in plasma distribution and more uniform etching of a substrate. One approach has been to employ a rotating magnetic field to more uniformly distribute plasma density differences. The rotating magnetic field is generated using two pairs of electromagnetic coils located on opposite sides of the reaction chamber. The coils in each coil pair are coaxially aligned with one another. Current flowing in one pair of coils produces a magnetic field perpendicular to the magnetic field produced by a current flowing in the other pair of coils, i.e., the current flows in opposite directions through adjacent coils. When the pairs of coils are driven by sinusoidal currents that are 90° out of phase, the coils create a rotating magnetic field parallel to the upper surface of the substrate in the reaction chamber.

While the use of a rotating magnetic field relative to the wafer can significantly reduce time-average spatial non-uniformity in the ion flux bombarding the wafer and thus can provide greater uniformity in etch rates, as noted in U.S. Pat. No. 6,113,731 (Shan et al.), it does not improve the instantaneous spatial uniformity of the ion flux on the wafer surface. Consequently, this approach does not avoid charge up damage to the components of a wafer substrate.

Shan et al. addresses this problem through the use of a magnetic field pattern in which the direction of the magnetic field at any point within the reaction region is approximately the vector cross-product of (1) the gradient of the magnitude of the magnetic field at that point, and (2) a vector extending perpendicularly from the substrate surface toward the plasma. The direction of this magnetic field produces an E×B drift of electrons in the pre-sheath away from the region where the magnitude of the magnetic field is highest, and toward the region where the magnitude is lowest. Consequently, the resulting E×B drift counteracts to some extent the tendency for the rate of production of free electrons to be highest in the region where the magnitude of the magnetic field is highest.

While the approach of Shan et al. represents a notable improvement in the art and does improve the instantaneous spatial uniformity of the ion flux on the wafer surface, it has been found that, even with the use of this approach, some non-uniformities in plasma densities and etch rates still persist, especially at regions of the substrate disposed closest to the vertices formed by adjacent electromagnets. This type of phenomenon, which is known as a "plasma depletion effect", can still result in substrate damage and non-uniform etch patterns in the regions in which it occurs.

There is thus a need in the art for a method for achieving greater uniformity in plasma densities and etch rates in a magnetically enhanced plasma etch reactor, and for an apparatus adapted to implement such a method. In particular, there is a need in the art for a magnetically enhanced plasma etch reactor which reduces or eliminates the plasma depletion effect observed at regions of the substrate disposed closest to the vertices formed by adjacent electromagnets. These and other needs are met by the devices and methodologies disclosed herein.

SUMMARY OF THE INVENTION

In one aspect, a magnetic field-enhanced plasma reactor is disclosed herein comprising a reaction chamber for applying a plasma to a substrate, and a first and second set of primary electromagnets disposed about said reaction chamber. The first set of primary electromagnets is provided with a first adjustable current source and the second set of primary electromagnets is provided with a second adjustable current source. The ratio $R=I_2/I_1$, wherein $I_1$ is the current provided by the first current source, $I_2$ is the current provided by the second current source, and $I_1>I_2$, is maintained within the range $-1<R<1$. If the current applied to each of the electromagnets in the first and second set of primary electromagnets is independently regulated or is applied by a separate current source, then the values $I_1$ and $I_2$ noted above are the average values of the currents applied to the members of the first and second set of primary electromagnets, respectively. It is found that, by maintaining R within this range, uniformity in ion flux can be achieved, while allowing a broader range of processing conditions (e.g., pressure and chemistry) than would be the case with processes in which R is restricted to a narrower range.

The first and second sets of primary electromagnets typically contain two members each, and the members of each set are disposed on adjacent sides of the reactor. In a typical configuration, then, each primary electromagnet of the first set will have a primary electromagnet of the second set disposed on the opposing side of the reaction chamber. Typically, at least two adjacent primary electromagnets have a secondary electromagnet (and more typically, at least two secondary electromagnets) nested within each of their perimeters, or within a region defined by a right rectangular prism having the largest perimeter that fits within the outer perimeter of the primary electromagnet. More typically, at least two adjacent primary electromagnets have outer perimeters and inner perimeters with at least one secondary electromagnet disposed within a region defined by a right rectangular prism having the largest perimeter that fits within the inner perimeter of each of the primary electromagnets. Most typically, each of the primary electromagnets has an outer perimeter and an inner perimeter and, for any given primary electromagnet, at least one secondary electromagnet is disposed within a region defined by a right rectangular prism having the largest perimeter that fits within the inner perimeter of the primary magnet. This "nested" configuration of electromagnets has been found to be effective at eliminating the non-uniformities in plasma densities and etch rates which would otherwise tend to occur at regions of the substrate disposed closest to the vertices formed by adjacent electromagnets.

In some embodiments, the primary electromagnets are dynamically assigned by a computer or other control device such that, at any point in time, a given primary electromagnet may be a member of either the first or the second set or primary magnets. Such an embodiment is particularly useful where it is desired to create a rotating magnetic field within the reaction chamber.

In another aspect, a method for etching a substrate is provided. In accordance with the method, a magnetic field-enhanced plasma reactor is provided which has a reaction chamber for applying a plasma to a substrate, and which also has first and second sets of primary electromagnets disposed about the reaction chamber. A first current is applied to the first set of electromagnets, and a second current is applied to the second set of magnet. The ratio R of the second current to the first current, which is defined above, is maintained within the range $-1<R<1$, or more typically within the range $0.1<R<0.4$.

In another aspect, a magnetic field-enhanced plasma reactor is provided which comprises a reaction chamber for applying a plasma to a substrate, a plurality of primary electromagnets are disposed about said reaction chamber, and at least two secondary magnets. Each of at least two of the primary electromagnets has at least one secondary electromagnet disposed within a region defined by a right rectangular prism having the largest perimeter that fits within the outer perimeter of the primary magnet. Typically, each of at least two of the primary electromagnets has an outer perimeter and an inner perimeter, and at least one secondary electromagnet is disposed within a region defined by a right rectangular prism having the largest perimeter that fits within the inner perimeter of the primary magnet. Even more typically, each of the primary electromagnets has an outer perimeter and an inner perimeter and, for any given primary electromagnet, at least one, and typically at least two, secondary electromagnets are disposed within a region defined by a right rectangular prism having the largest perimeter that fits within the inner perimeter of said primary magnet. The reactor may further comprise at least one current modulator adapted to apply an adjustable first current to a first set of the primary electromagnets and an adjustable second current to a second set of the primary electromagnets, wherein the ratio R (defined above) of the second current to the first current is within the range $-1<R<1$, and more typically within the range $0.1<R<0.4$.

In still another aspect, a magnetic field-enhanced plasma reactor is provided which comprises a reaction chamber for applying a plasma to a substrate. The reaction chamber comprises a reaction region having a first plurality of electromagnets disposed about its perimeter. The reactor further comprises a second plurality of electromagnets, each of which is disposed in the vicinity of at least one corner of a first region defined by a right rectangular prism having the smallest perimeter which encompasses the first plurality of magnets. At least one current modulator may also be provided which is adapted to modulate the current applied to the first and second plurality of electromagnets such that an adjustable magnetic field is created in the vicinity of at least one corner of the first region.

These and other aspects are described in greater detail below.

BRIEF DESCRIPTION OF THE DRAWINGS

FIGS. 12-17 are illustrations depicting the rotating magnetic field effect possible with some embodiments of plasma reactors made in accordance with the teachings herein.

DETAILED DESCRIPTION

The terms "primary magnet" and "secondary magnet" are used herein merely to distinguish two sets of electromagnets from each other for the sake of clarity; no further differences between the two sets of electromagnets (such as, for example, a relative difference in magnetic field strength or a difference in role or function) are stated or implied merely by the use of these terms.

Figure 1:
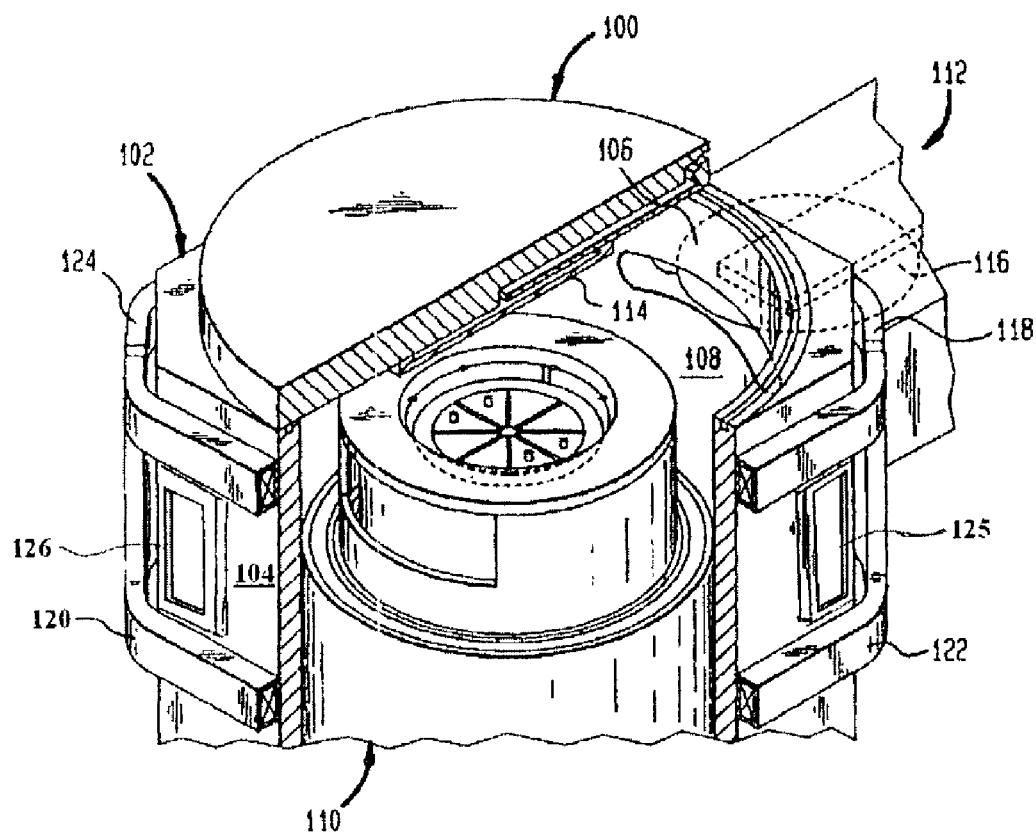
FIGS. 1 and 2 are isometric views, partially cut away, of two different embodiments of a magnetic field enhanced plasma reactor in accordance with the teachings herein.
Figure 2:
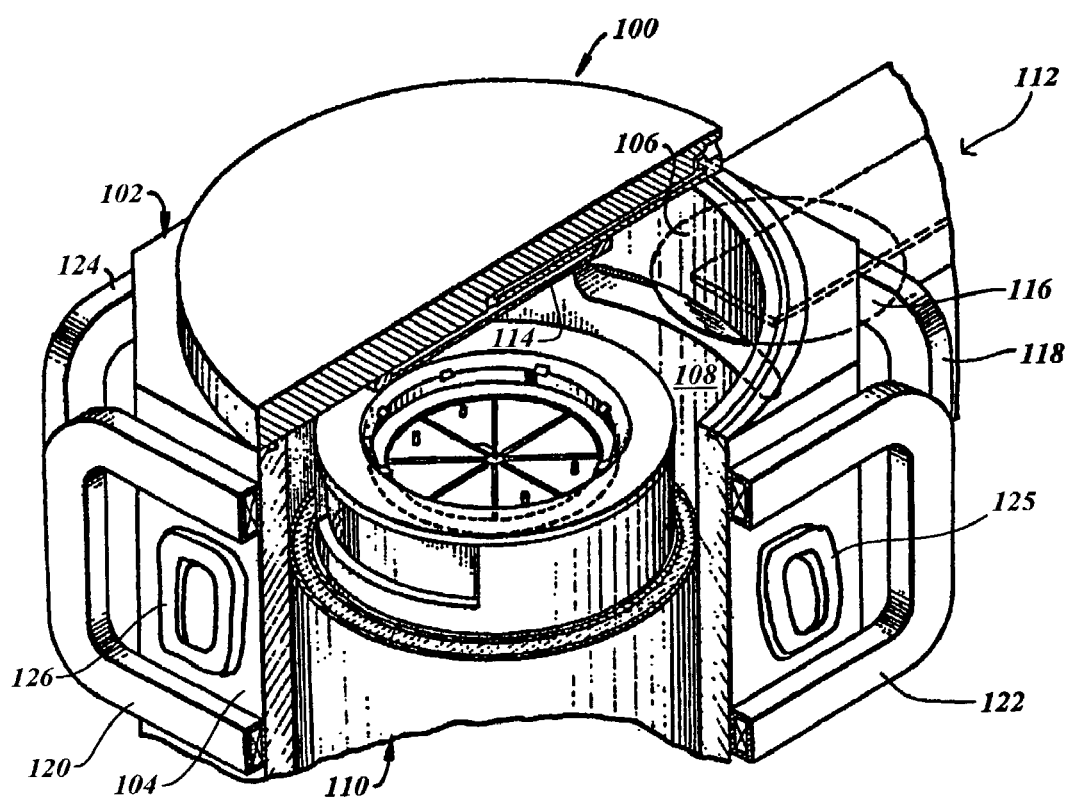
Figure 3:
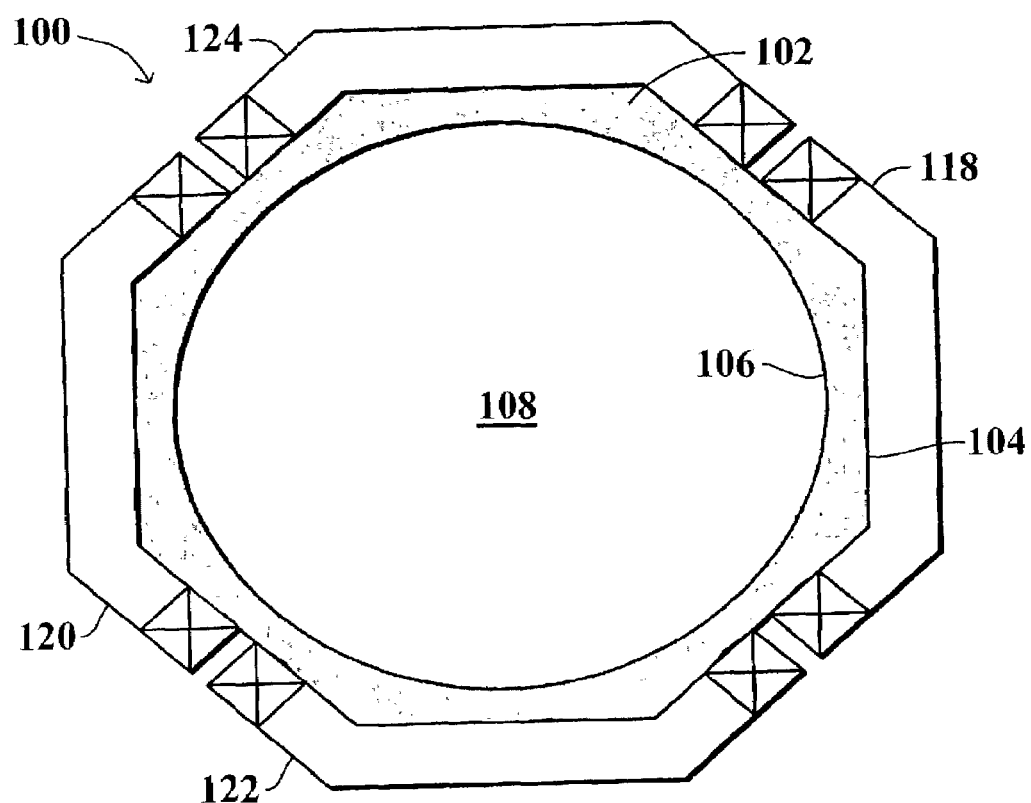
FIG. 3 is an illustration of a top view of the reactor of FIG. 1 which depicts the deployment of electromagnets around the exterior wall of the reactor (some of the details of the interior of the reactor have been omitted for the sake of simplicity)

References made herein to the "vertices" formed by adjacent electromagnets refer to the vertices defined by the intersection of the planes in which the major surfaces of the electromagnets lie. If the electromagnets are "bent" as depicted in FIGS. 1 and 3, these planes are taken with respect to the main portion of the electromagnet. Thus, by way of illustration, electromagnets 120 and 124 in FIGS. 1 and 2 have major surfaces that lie in planes which intersect each other at a 90° angle, and the vertices formed by these two electromagnets is thus the line defined by the intersection of these two planes. In a reactor having two pairs of electromagnets disposed on adjacent sides of the reactor, these vertices may also frequently be described as the four parallel sides of the rectangular prism of smallest volume which contains the electromagnets.

References made herein to a first and second set of primary electromagnets are meant to illustrate the relationship between the primary electromagnets at a given point in time. In some embodiments, this relationship may change over time such that, at any given point in time, a particular primary electromagnet may be a member of either the first set of primary electromagnets or the second set of primary electromagnets. A case in point is where a rotating magnetic field is employed in the reaction chamber, in which case the assignment of primary electromagnets to the first or second set occurs dynamically and is typically controlled by an operating system or other control device.

It has now been surprisingly found that the aforementioned problems with non-uniformities in plasma densities and etch rates in a magnetically enhanced plasma etch reactor, and especially those non-uniformities observed at regions of the substrate which are disposed closest to the vertices formed by adjacent electromagnets, can be overcome through the utilization of a compensating magnetic field in these portions of the reaction region. Such a compensating magnetic field may be achieved, for example, through the use of electromagnets having a nested configuration as described herein. The use of this compensating magnetic field in plasma etch reactors of the type described in U.S. Pat. No. 6,113,731 (Shan et al.) is found to virtually eliminate the plasma depletion effect in regions of the substrate which are disposed closest to the vertices formed by adjacent electromagnets, while preserving the many desirable advantages of these reactors.

Figure 4:
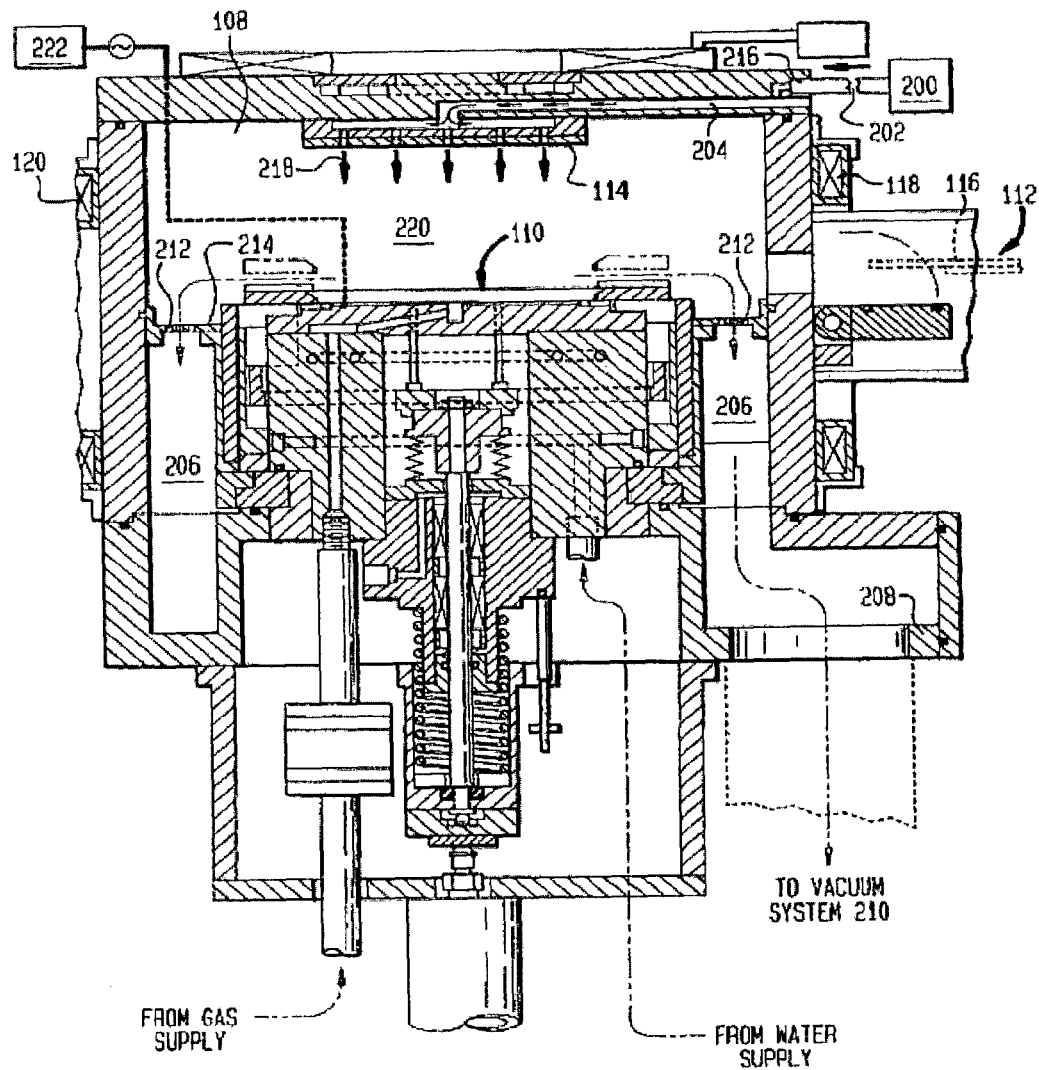
FIG. 4 is a vertical cross-section of the reactor shown in FIG. 1.

One example of an embodiment of a magnetically enhanced plasma etch reactor in accordance with the present invention is depicted in FIGS. 1, 3 and 4 (the details of the interior of the reactor have been omitted from FIG. 3 to better illustrate the disposition of the primary electromagnets 118, 120, 122 and 124 about the exterior wall of the reactor). Specifically, the reactor system 100 depicted therein comprises a housing 102 having octagon-shaped outer walls 104 and a circular inner wall 106 defining a reaction chamber 108. The system also includes a gas and liquid cooled pedestal/cathode assembly 110 and a wafer (substrate) exchange system 112. The wafer exchange system 112 cooperates with the pedestal assembly 110 to facilitate positioning of a substrate 116 upon assembly 110 and removal of the substrate 116 from the chamber 108 after etching.

With reference to FIG. 4, process gases are supplied to the interior of the chamber 108 by a gas manifold 114 from a gas supply system 200. The gas supply system 200 communicates with the manifold 114 and chamber 108 via supply lines 202 and conduit 204. A vacuum is created in the chamber and spent gases are exhausted via annular exhaust chamber 206 communicating with exhaust port 208 connected to a vacuum pumping system 210. The exhaust flow is directed from the chamber 108 through holes 212 in a horizontal annular plate 214 mounted about the upper periphery of the cathode assembly 110. The plate 214 inhibits plasma penetration into the annular exhaust chamber 206 (in some variations of the reactor, an "S-curve" and/or magnetic confinement may be used in place of the plate).

A conduit 204 routes a reactant gas such as carbon tetrafluoride ($CF_4$), for example, from inlet 216 into manifold 114. The gas exits the manifold downwardly (as indicated by arrows 218 in FIG. 4). When RF power is applied to the cathode assembly 110, an etching plasma is formed in chamber processing region 220. An RF power supply system 222 supplies RF power to the reactor system 100 to generate the plasma.

Figure 5:
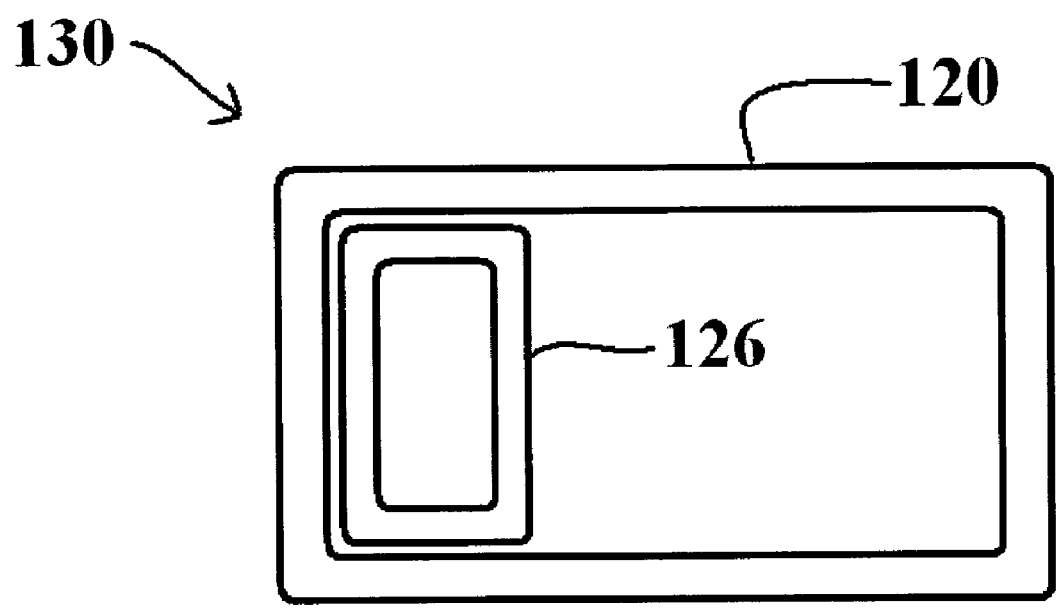
FIG. 5 is a schematic representation of an electromagnet structure in accordance with the teachings herein.

Referring again to FIGS. 1 and 3, in order to control the plasma, the reactor system 100 further includes a plurality of primary electromagnets 118, 120, 122 and 124. Each of the primary electromagnets typically comprises copper coils (typically constructed from 14 gauge insulated copper wire) forming a rectangular element (see FIG. 5; note that the electromagnets may be planar as depicted in FIGS. 2 and 5, or may be "bent" as shown in FIGS. 1 and 3 to compliment the exterior of the reactor and thereby reduce the overall size of the device). The electromagnets are mounted around the perimeter of the chamber processing region 220 such that the main portion of each of the electromagnets are positioned on alternating outer walls of the octagon-shaped housing 104. As such, any two adjacent primary electromagnets are spatially positioned in a substantially orthogonal arrangement with respect to one another.

In the embodiment of the reactor system depicted in FIGS. 1, 3 and 4, the primary electromagnets 118, 120, 122 and 124 are bent at a 45° angle at each end to facilitate their placement around the octagon-shaped, outer walls 104 of the reactor. Such an arrangement has the advantage of being more compact. However, in other embodiments of the reactor system in accordance with the teachings herein, the primary electromagnets may be planar. One such embodiment is shown in FIGS. 2 and 5, where like reference numerals refer to the same or similar elements. Secondary electromagnets 125 and 126 are also illustrated in FIGS. 1 and 2, details of which are described below.

As shown in FIG. 5, in a typical embodiment, at least one of the primary electromagnets 120 has one 126 of a plurality of secondary electromagnets disposed within it in a nested arrangement. Together, the two electromagnets form a composite electromagnet 130. More typically, at least two adjacent primary electromagnets are arranged in such a nested structure, and most typically, all of the primary electromagnets are arranged in such a nested structure. The primary and secondary electromagnets 120 and 126 are adapted to interact with each other in a way that eliminates the plasma depletion which might otherwise occur at the vertex between adjacent primary electromagnets. The interaction of the primary and secondary electromagnets in this manner is explained in greater detail below.

In the composite electromagnets described herein, the perimeter of each of the primary electromagnets essentially defines a plane of orientation (in the case where each of the first plurality of electromagnets are bent (e.g., at 45°) at each end to facilitate their placement around, for example, a reactor whose exterior is octagonal, the plane being referred to here is the plane in which the perimeter of the center portion of the electromagnet lies). The perimeter of each of the secondary electromagnets likewise essentially defines a plane of orientation. In the preferred embodiment, the primary and secondary electromagnets forming a composite electromagnet are disposed in a nested arrangement, that is, the planes of orientation of the primary and secondary electromagnets are coplanar. However, in some embodiments, the planes of orientation of the primary and secondary electromagnets which form a composite electromagnet are parallel but not coplanar, that is, the secondary electromagnet is offset from the primary electromagnet along an axis perpendicular to the plane of orientation of the primary electromagnet such that the planes of orientation of the two magnets are parallel but not coplanar.

Figure 6:
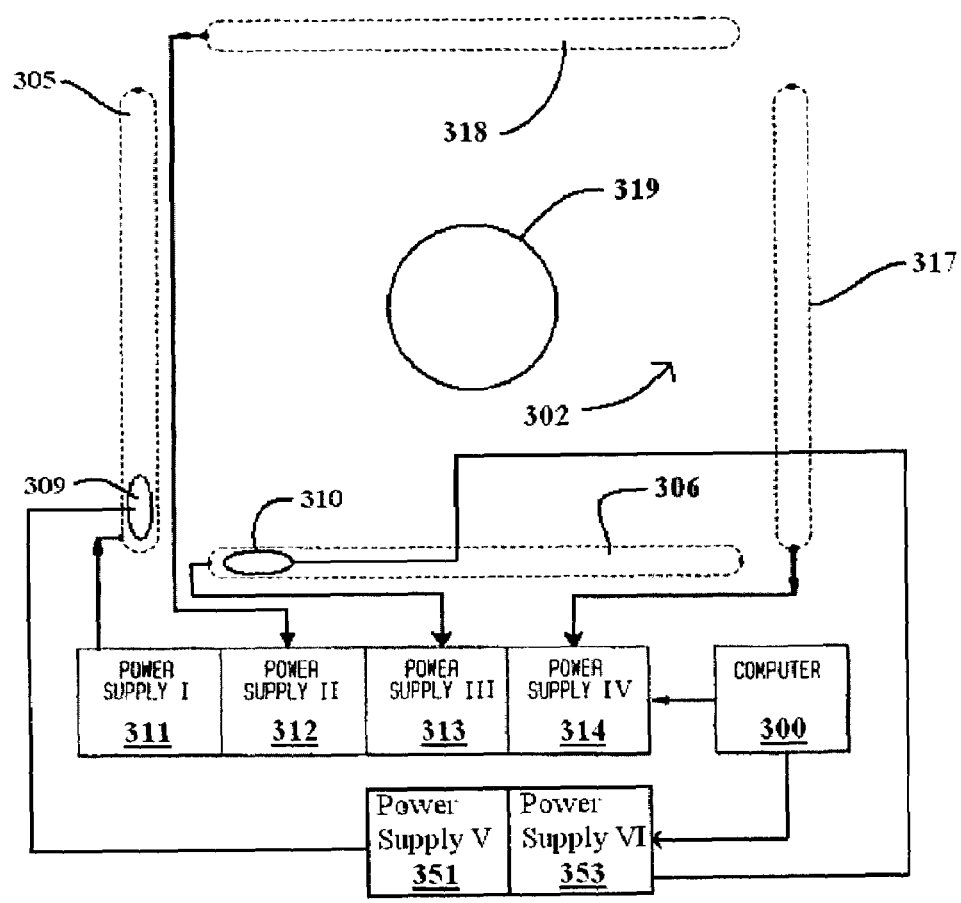
FIG. 6 is a schematic representation of a magnetically enhanced plasma etch reactor in accordance with the teachings herein.

FIG. 6 illustrates one possible embodiment of a suitable power supply for the electromagnets of a plasma reactor in accordance with the teachings herein. As shown in FIG. 6, power supplies 311, 312, 313 and 314 are provided to supply power to primary electromagnets 305, 306, 317 and 318, and power supplies 351 and 353 are provided to provide power to secondary electromagnets 309 and 310, respectively. Power supplies 311, 312, 313, 314, 351 and 353 are collectively referred to as power supply 302. The current (typically DC) applied to each of the primary and secondary electromagnets by the power supply system 302 to influence the plasma in the reaction chamber is controlled by a computer 300. The computer 300 regulates the magnitude and direction (polarity) of the currents applied to each of the primary 305, 306, 317, 318 and secondary 309, 310 electromagnets, and thus controls the magnitude of the magnetic fields generated by the primary and secondary electromagnets. In this way, the computer controls the resultant magnetic field vector formed by the combination of these magnetic fields which acts on the reaction region 319, and thus can modify the etch rate experienced by a particular region of the substrate (e.g., to adjust for non-uniformities).

Of course, one skilled in the art will appreciate that, while the particular embodiment noted above employs four primary electromagnets and two secondary electromagnets, various numbers of primary and secondary electromagnets may be employed in this type of system. Typically, however, the computer will be able to individually control or alter the magnitude and direction (polarity) of the currents applied to each of these primary and secondary electromagnets. Moreover, while FIG. 6 depicts each electromagnet as having its own dedicated power source, one skilled in the art will appreciate that a similar result can be achieved by utilizing a common power source for two or more of the electromagnets, but providing each electromagnet with its own current or voltage regulator or modulator.

Typically, the reactor system is set up such that the computer can independently control each of the primary and secondary electromagnets so that the magnitude and polarity of the magnetic fields generated by each individual electromagnet can be individually controlled. In some embodiments, however, the system may be set up such that at least some of the electromagnets are controlled as pairs (in some embodiments, these electromagnets may be controllable only as pairs). This may be accomplished, for example, by hard-wiring the system such that two or more of the electromagnets are controllable as a pair, or by providing a hardware or software setting that results in two or more of the electromagnets being controllable as a pair. The current or voltage applied to each electromagnet in a pair need not be the same, as it may be necessary to compensate for slight differences in the physical or operational characteristics of the two magnets.

Typically, the primary electromagnets disposed on the sides of the reactor will be set up to be controllable as pairs of adjacent magnets, and the secondary electromagnets will each be independently controlled. This type of arrangement is advantageous in that, as noted previously and further explained below, the magnetic field can be programmed to rotate around the reaction chamber, thus eliminating some common causes of plasma non-uniformity.

The current magnitude for each electromagnet surrounding the reactor 100 may be selected by the computer (or by a human operator) in accordance with some predefined algorithm or table, and may change dynamically while the reaction chamber is in operation. The ability to independently select the current in each electromagnet in the system permits the computer or operator to fine-tune the resultant magnetic field within the reactor 100, and especially at portions of the reaction region in the vicinity of the vertices formed by adjacent primary electromagnets, thus resulting in enhanced plasma uniformity and a more uniform etch pattern over the entire upper surface of the processed substrate.

The currents selected for each of the primary and secondary electromagnets will typically be those which have been determined to produce a desired magnetic field vector (that is, a composite magnetic field formed from the magnetic fields of each electromagnet in the system, the later of which may be thought of as basis vectors for the magnetic field vector space) or which have been empirically found to produce optimal results for a given process. The current magnitudes may be selected from a menu or table of current magnitudes (though in some embodiments appropriate current magnitudes may be calculated periodically in accordance with a formula or algorithm). Thus, for example, the computer may be adapted to retrieve, in response to a particular current magnitude selection, an appropriate command signal from a current magnitude table. Such current magnitude tables will typically be stored in a memory system associated with the computer 300. The computer 300 may comprise any compatible processor such as, for example, the one as utilized in the system described in U.S. Pat. No. 5,674,321 (Pu et al.).

In one particular embodiment of the system depicted in FIG. 6, the power supply system 302 contains a four-channel power amplifier. The amplifier is typically a switching amplifier capable of controlling the current in four separate inductive/resistive loads. The power supply system provides the first set 305 and 306 of primary electromagnets with a first adjustable current (the current flows through each of these electromagnets in the same direction, e.g., in a clockwise direction), and provides the second set 317 and 318 of primary electromagnets with a second adjustable current. The ratio $$R = I_2/I_1 \quad \text{(EQUATION I)}$$

wherein $I_1$ is the current applied at any point in time to the first set of primary electromagnets, $I_2$ is the current applied at any point in time to the second set of primary electromagnets, and $I_1 > I_2$, is maintained within the range $-1 < R < 1$, and more typically within the range $0.1 < R < 0.4$.

The second current $I_2$ does not necessarily flow through electromagnets 317 and 318 in the same direction as the first current $I_1$ applied to electromagnets 305 and 306. Similarly, a third current is applied to one of the secondary electromagnets 309 within the region bounded by the perimeter of electromagnet 305. A fourth current is also applied to the other of the secondary electromagnets 310 disposed within the region bounded by the perimeter of electromagnet 306. Here also, the current flows through the secondary electromagnets 309 and 310 in the same direction, which is not necessarily the same direction as that of the current applied to the primary electromagnets.

The magnitude and direction of the currents in the primary and secondary electromagnets may be selected by the operator or operating system controlling the reaction chamber, depending on the results desired. Thus, for example, the magnetic field generated by the currents in the secondary electromagnets may vary from the same magnitude and direction as the field from the primary electromagnets to the same magnitude and opposite direction as the primary electromagnets. When the primary and secondary electromagnets are driven in this manner, a diverging field is created which acts upon the region of the substrate closest to the vertex formed between adjacent primary electromagnets. This diverging field is the result of the destructive combination of fields generated by the secondary electromagnets 309 and 310 with fields generated by the primary electromagnets 305, 306, 317 and 318. In particular, the destructive combination of the magnetic fields generated by the secondary electromagnets 309 and 310 and the magnetic fields generated by the primary electromagnets 305, 306, 317 and 318 results in a diverging magnetic field that eliminates plasma depletion effects of the type observed in portions of the substrate disposed closest to the vertice formed by the first set of adjacent primary magnets.

Figure 7:
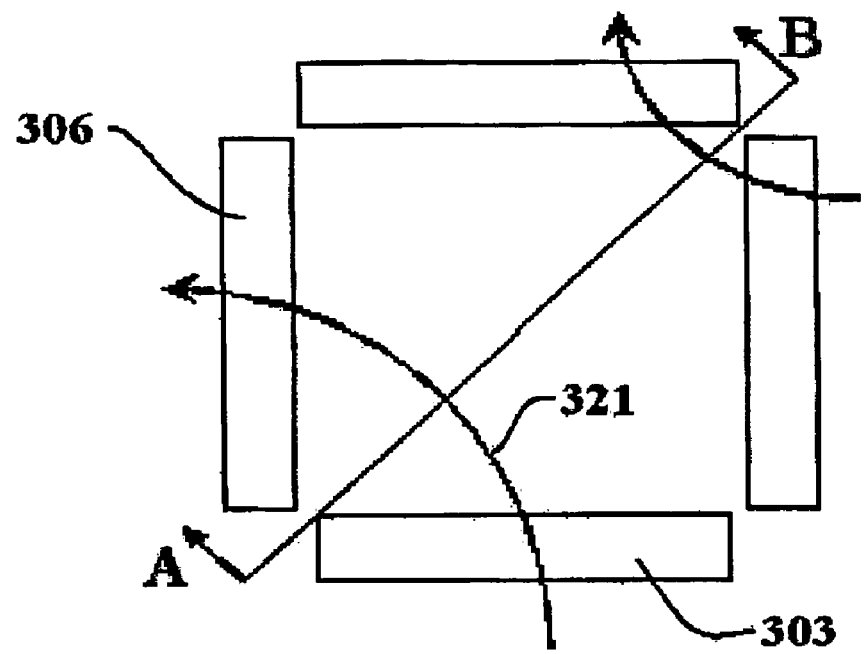
FIG. 7 is an illustration of the magnetic field effect of a conventional plasma reactor having two pairs of adjacent electromagnets disposed about the periphery of the reaction chamber.

The effect of the destructive combination of magnetic fields generated by the primary and secondary electromagnets is further illustrated in FIGS. 7-11. FIG. 7 illustrates a system of the type depicted in U.S. Pat. No. 6,113,731 (Shan et al.) consisting only of adjacent pairs of primary electromagnets. The direction of the magnetic field in the reaction region closest to the lower left-hand corner formed by adjacent primary electromagnets 303 and 306 is indicated by the arrow 321. The magnitude of the resultant magnetic field strength for this type of set-up along a line between location A and location B in the reactor is depicted graphically as curve B in FIG. 11, where it is seen that the magnetic field strength varies from a high value near location A to a lower value near location B.

Figure 8:
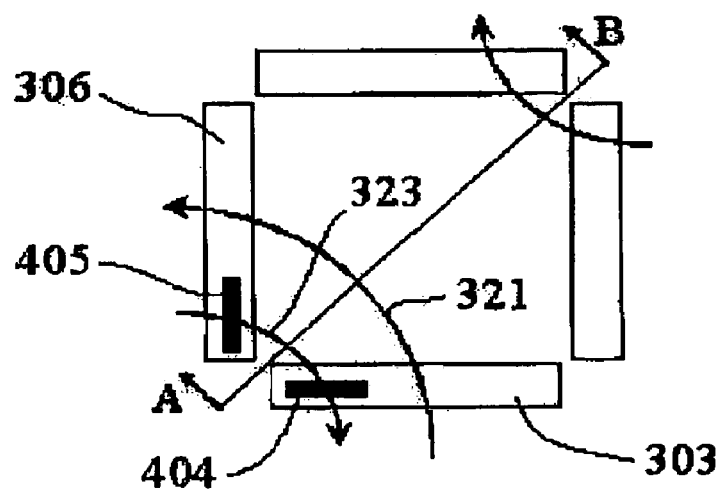
FIGS. 8-10 are illustrations of the magnetic field effect of electromagnets disposed in various possible configurations about the exterior of a reactor in accordance with the teachings herein.

In contrast to the situation depicted in FIG. 7, FIG. 8 depicts an embodiment of a magnetically enhanced plasma reactor in accordance with the teachings herein. In the device of FIG. 8, secondary electromagnets 404 and 405 are nested within primary electromagnets 303 and 306, respectively, and are disposed close to location A. As indicated by arrow 323, when current is applied to both the primary and secondary electromagnets, the adjacent secondary electromagnets 404 and 405 cooperate to generate a magnetic field which is opposite in direction to the magnetic field 321 established by the adjacent primary electromagnets 303, 306. As a result of destructive interference between these two fields, a combined, tailored B-field is created, the magnitude of which is depicted as CURVE A of FIG. 11 for points close to location A (the magnitude of the tailored field is essentially given by CURVE B for points removed from location A). As seen therein, the magnitude of this tailored magnetic field is reduced in the vicinity of location A as compared to the magnitude of the magnetic field established by the primary electromagnets alone. This tailored B-field prevents plasma depletion and electron pile-up due to E×B drift, thus resulting in greater uniformity in plasma densities and etch rates in the vicinity of location A. By varying the current applied to secondary electromagnets 404 and 405, the magnitude of the combined magnetic field at location A can be selectively reduced within a desired range of magnitudes. In this manner, plasma depletion effects which might otherwise tend to occur at portions of a substrate disposed close to location A due to non-uniform magnetic field strength in this region are eliminated.

Figure 9:
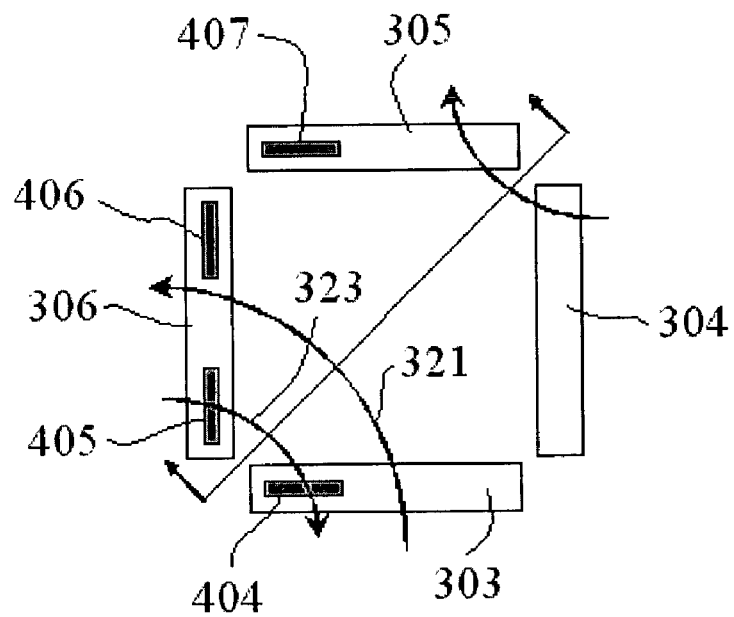
Figure 10:
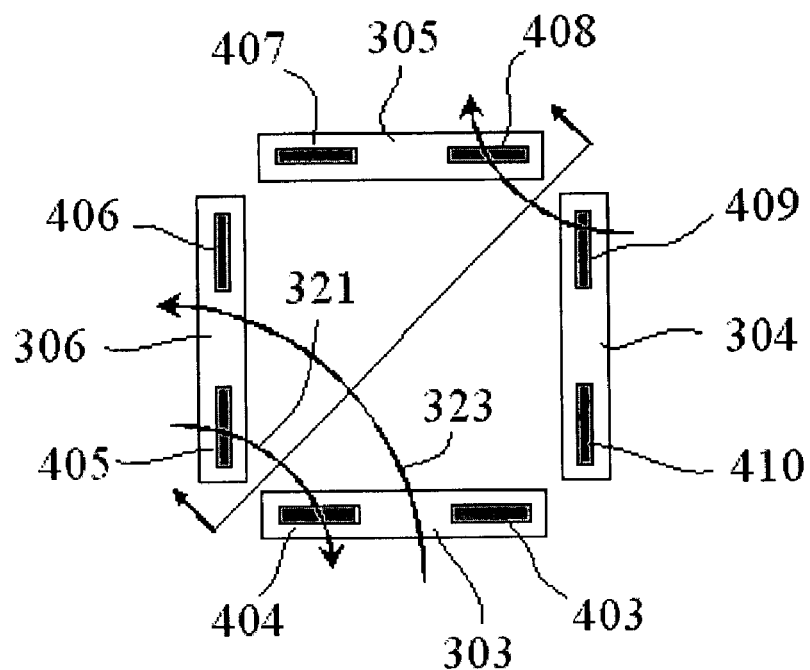
Figure 11:
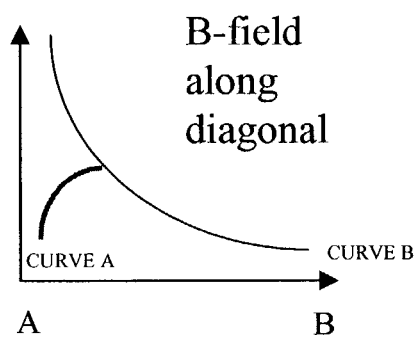
FIG. 11 is a graph which compares magnetic field strength as a function of location within the reaction chamber for a conventional plasma reactor (CURVE A) to magnetic field strength as a function of location within the reaction chamber for a plasma reactor made in accordance with the teachings herein (CURVE B)

As indicated by FIGS. 9 and 10, the secondary electromagnets may be deployed in a number of different schemes. Typically, however, the electromagnets are deployed such that one of the secondary electromagnets nested within each of two adjacent primary electromagnets are themselves adjacent to each other (that is, one secondary electromagnet is disposed on each side of the vertex formed by a pair of adjacent primary electromagnets). Thus, in FIG. 9, primary electromagnet 306 has two secondary electromagnets 405, 406 nested therein, while primary electromagnets 303, 305 have one each of secondary electromagnets 404 and 407 disposed therein, respectively, and primary electromagnet 304 has no secondary electromagnets disposed therein. As a result of the arrangement of primary and secondary electromagnets, secondary electromagnets 404 and 405 are adjacent to each other, while secondary electromagnets 406 and 407 are also adjacent to each other.

In FIG. 10, each of the primary electromagnets 303, 304, 305 and 306 contains two of the secondary electromagnets 403, 404, 405, 406, 407, 408, 409, and 410 disposed at opposing ends of the primary electromagnet. One skilled in the art will appreciate, of course, that embodiments of the reactor systems made in accordance with the teachings herein may contain almost any number of primary and secondary electromagnets, and that these electromagnets may be arranged around the reaction region in a number of different ways. Moreover, while it is preferable that all of the primary electromagnets are of the same dimensions and/or construction and that all of the secondary electromagnets are of the same dimensions and/or construction, reactor systems may be made in accordance with the teachings herein in which this is not the case. Also, as previously noted, the first and second set of primary electromagnets may not be defined by their physical location, but may be dynamically assigned, for example, through a software system operating the reactor.

It is also possible for the primary and secondary electromagnets to be driven with an AC current, as directed by the computer 300. At any moment in time, this current may flow in the same or different direction through each of the electromagnet structures. Thus, for example, if the primary electromagnets are operated as pairs, each of the primary and secondary electromagnets in each pair may be driven with substantially identical AC currents or varied currents. Driving the electromagnet structures in this manner generates an oscillatory magnetic field.

Figure 12:
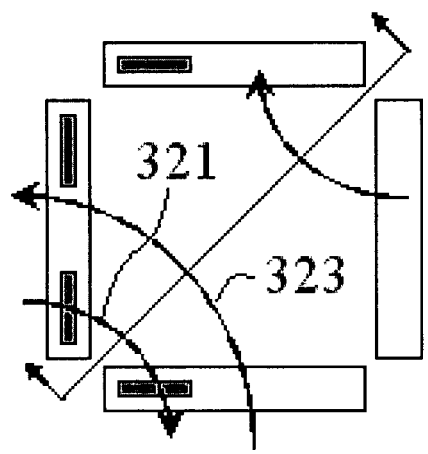
Figure 13:
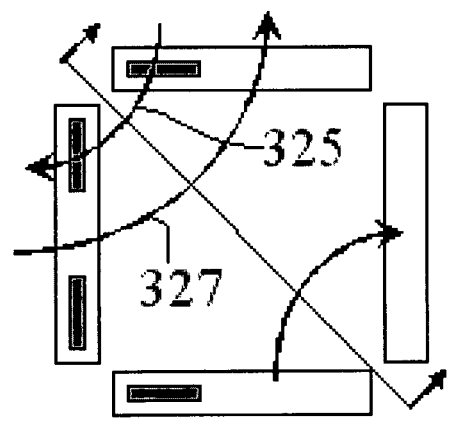

Arrangements of electromagnets of the type disclosed herein allow for the creation of diverging magnetic fields established by the primary and secondary electromagnets that can selectively operate upon portions of a substrate in the vicinity of the vertex between any two adjacent primary electromagnets. In an arrangement such as that shown in FIG. 8, the diverging fields 321 and 323 are stationary. However, in an arrangement such as that shown in FIG. 9, the diverging magnetic fields can be made to switch between a first and second state as shown in FIGS. 12 and 13. In the first state (depicted in FIG. 12), diverging fields 321 and 323 are established by secondary electromagnets 404 and 405 and by primary electromagnets 303 and 306, respectively. In the second state (depicted in FIG. 13), diverging fields 325 and 327 are established by secondary electromagnets 406 and 407 and by primary electromagnets 306 and 305, respectively.

In an arrangement such as that shown in FIG. 10, the diverging magnetic fields can be programmed to rotate in a stepwise fashion around the reaction chamber as depicted in FIGS. 14-17 to improve the uniformity of the plasma and to eliminate plasma focusing or depletion within the reaction chamber. The rotation is accomplished by first generating diverging magnetic fields 321 and 323, for a predetermined time interval, between primary electromagnets 303 and 306 and secondary electromagnets 404 and 405 as depicted in FIG. 14. Following the predetermined time interval, diverging fields 325 and 327, 329 and 331, and 333 and 335 (see FIGS. 15, 16, and 17, respectively) are successively generated in a similar manner, and for successive predetermined time intervals, at different locations within the reaction chamber to enhance plasma uniformity during processing of a wafer within the chamber. Since the reaction chamber is effectively surrounded by the primary and secondary electromagnets, this approach is particularly suitable for reaction chambers such as the eMAX Centura chamber (available commercially from Applied Materials, Inc., Santa Clara, Calif.). In this approach, the current applied to the primary and secondary electromagnets is controlled by a computer in a manner similar to that discussed in reference to FIG. 6 and adapted to include eight secondary electromagnets.

During use of the plasma reactors noted above, after the wafer is processed, the etch pattern of the wafer is inspected for non-uniformities. If the inspection reveals that the etch pattern meets specifications for uniformity of etch, then the selected current magnitudes are established as the standard for future use in the mass production of wafers using the reactor system. If, on the other hand, the inspection reveals that the resulting etch pattern does not meet predetermined specifications for etch uniformity, a different current magnitude is selected and the etch process is repeated until the etch pattern of the processed wafer meets such specifications. Through this type of approach, damage caused by plasma non-uniformities or plasma depletion effects may be reduced or eliminated.

All the features disclosed in this specification (including any accompanying claims, abstract and drawings), and/or all of the steps or any method or process so disclosed, may be combined in any combination, except combinations where at least some of the features and/or steps are mutually exclusive. Each feature disclosed in this specification (including any accompanying claims, abstract and drawings) may be replaced by alternative features serving the same equivalent or similar purpose, unless expressly stated otherwise. Thus unless expressly stated otherwise, each feature disclosed is one example only of a generic series of equivalent or similar features. Moreover, although a specific embodiment is specifically illustrated and described herein, it will be appreciated that modifications and variations of the invention are covered by the above teachings and within the purview of the appended claims without departing from the spirit and intended scope of the invention.

What is claimed is:

1. A magnetic field-enhanced plasma reactor, comprising:
    a reaction chamber adapted to apply a plasma to a substrate; and
    a first and second set of primary electromagnets having inner and outer perimeters disposed about said reaction chamber, said first set of primary electromagnets being provided with a first adjustable current and said second set of primary electromagnets being provided with a second adjustable current; and
    a secondary electromagnet nested within the inner perimeter of one of said primary electromagnets;
    wherein the reactor is adapted to maintain the ratio $R=I_2/I_1$ during etching within the range $-1<R<1$, wherein $I_1$ is the current provided by the first current source, wherein $I_2$ is the current provided by the second current source, and wherein $I_1>I_2$, and
    comprising a plurality of secondary electromagnets, wherein each of the primary electromagnets of the first set has at least one secondary electromagnet nested within its inner perimeter.

2. The magnetic field-enhanced plasma reactor of claim 1, wherein the first set comprises first and second primary electromagnets, wherein said first primary electromagnet has a first secondary electromagnet nested within its inner perimeter, wherein said second primary electromagnet has a second secondary electromagnet nested within its inner perimeter, and wherein the first and second secondary electromagnets are adjacent to each other.

3. A magnetic field-enhanced plasma reactor, comprising:
    a reaction chamber adapted to apply a plasma to a substrate; and
    a first and second set of primary electromagnets having inner and outer perimeters disposed about said reaction chamber, said first set of primary electromagnets being provided with a first adjustable current and said second set of primary electromagnets being provided with a second adjustable current; and
    a secondary electromagnet nested within the inner perimeter of one of said primary electromagnets;
    wherein the reactor is adapted to maintain the ratio $R=I_2/I_1$ during etching within the range $-1<R<1$, wherein $I_1$ is the current provided by the first current source, wherein $I_2$ is the current provided by the second current source, and wherein $I_1>I_2$; and
    wherein at least one of the primary electromagnets has at least one secondary electromagnet disposed within a region defined by a right rectangular prism having the largest perimeter that fits within the outer perimeter of the at least one primary electromagnet.

4. A magnetic field-enhanced plasma reactor, comprising:
    a reaction chamber adapted to apply a plasma to a substrate; and
    a first and second set of primary electromagnets having inner and outer perimeters disposed about said reaction chamber, said first set of primary electromagnets being provided with a first adjustable current and said second set of primary electromagnets being provided with a second adjustable current; and
    a secondary electromagnet nested within the inner perimeter of one of said primary electromagnets;
    wherein the reactor is adapted to maintain the ratio $R=I_2/I_1$, during etching within the range $-1<R<1$, wherein $I_1$ is the current provided by the first current source, wherein $I_2$ is the current provided by the second current source, and wherein $I_1 > I_2$, and wherein at least one secondary electromagnet is disposed within a region defined by a right rectangular prism having the largest perimeter that fits within the inner perimeter of the at least one primary electromagnet.

5. A magnetic field-enhanced plasma reactor, comprising:
a reaction chamber adapted to apply a plasma to a substrate; and
a first and second set of primary electromagnets having inner and outer perimeters disposed about said reaction chamber, said first set of primary electromagnets being provided with a first adjustable current and said second set of primary electromagnets being provided with a second adjustable current; and
a secondary electromagnet nested within the inner perimeter of one of said primary electromagnets;
wherein the reactor is adapted to maintain the ratio $R = I_2/I_1$ during etching within the range $-1 < R < 1$, wherein $I_1$ is the current provided by the first current source, wherein $I_2$ is the current provided by the second current source, and wherein $I_1 > I_2$, and
wherein, for any given primary electromagnet, at least one secondary electromagnet is disposed within a region defined by a right rectangular prism having the largest perimeter that fits within the inner perimeter of said primary electromagnet.

6. The magnetic field-enhanced plasma reactor of claim 5 wherein, for any given primary electromagnet, at least two secondary electromagnets are disposed within a region defined by a right rectangular prism having the largest perimeter that fits within the inner perimeter of said primary electromagnet.

7. A magnetic field-enhanced plasma reactor, comprising:
a reaction chamber comprising a cathode and an anode that are adapted to apply a plasma to a substrate;
a first and second primary electromagnet disposed about said reaction chamber and having a plane of orientation that is orthogonal to the surface of said cathode, said first and second primary electromagnets having an outer perimeter and an inner perimeter; and
a first and second secondary electromagnet;
wherein said first secondary electromagnet is disposed within a region defined by a right rectangular prism having the largest perimeter that fits within the outer perimeter of said first primary electromagnet, and wherein said second secondary electromagnet is disposed within a region defined by a right rectangular prism having the largest perimeter that fits within the outer perimeter of said second primary electromagnet.

8. The magnetic field-enhanced plasma reactor of claim 7, wherein, for each of said first and second primary electromagnets, at least one secondary electromagnet is disposed within a region defined by a right rectangular prism having the largest perimeter that fits within the inner perimeter of said primary electromagnet.

9. The magnetic field-enhanced plasma reactor of claim 7, further comprising a third and fourth primary electromagnet.

10. The magnetic field-enhanced plasma reactor of claim 9, wherein said first and second primary electromagnets are adjacent to each other, and wherein said third and fourth primary electromagnets are adjacent to each other.

11. The magnetic field-enhanced plasma reactor of claim 10, further comprising at least one current modulator adapted to apply an adjustable first current $I_1$ to said first and second primary electromagnets and an adjustable second current $I_2$ to said third and fourth primary electromagnets, said current modulator being further adapted to maintain the ratio $R = I_1/I_2$, where $I_1 > I_2$, within the range $-1 < R < 1$.

12. The magnetic field-enhanced plasma reactor of claim 11, wherein $0.1 < R < 0.4$.

13. A magnetic field-enhanced plasma reactor, comprising:
a reaction chamber for applying a plasma to a substrate;
a plurality of primary electromagnets surrounding said reaction chamber; and
a plurality of secondary electromagnets, each of said secondary electromagnets being disposed in a nested relation with respect to one of said primary electromagnets.

14. The magnetic field-enhanced plasma reactor of claim 13, further comprising:
a first current source adapted to apply a variable first current to each of said plurality of primary electromagnets, so as to generate a primary magnetic field; and
a second current source adapted to apply a variable second current to each of said plurality of secondary electromagnets so as to generate a secondary magnetic field.

15. The magnetic field-enhanced plasma reactor of claim 13, wherein said primary and secondary magnetic fields combine to generate a resultant adjustable, diverging magnetic field proximate to at least one corner of the smallest rectangle which encompasses said primary electromagnets.

16. The magnetic field-enhanced plasma reactor of claim 13, further comprising at least one current modulator, operatively connected to said primary and secondary electromagnets, which is adapted to vary the current applied to each of said primary and secondary electromagnets.

17. The reactor of claim 13, wherein the current that flows through each of said primary electromagnets differs in magnitude from the current that flows through each of said secondary electromagnets.

18. The reactor of claim 13, wherein the current that flows through each of said primary electromagnets differs in direction from the current that flows through each of said secondary electromagnets.

19. The reactor of claim 13, wherein the current that flows through each of said primary electromagnets differs in both magnitude and direction from the current that flows through each of said secondary electromagnets.

20. The reactor of claim 13, wherein said plurality of primary electromagnets comprise first and second sets, wherein a first current $I_1$ is applied to the first set of said plurality of primary electromagnets and wherein a second current $I_2$ is applied to a second set said plurality of primary electromagnets, and wherein the ratio $R = I_2/I_1$, where $I_1 > I_2$, is maintained, during operation of the reactor, within the range $-1 < R < 1$.

21. The reactor of claim 13, wherein the reaction chamber comprises a cathode and an anode, and wherein said primary electromagnets each has a plane of orientation that is orthogonal to the surface of said cathode.

22. A magnetic field-enhanced plasma reactor, comprising:
a reaction chamber for applying a plasma to a substrate;
a plurality of primary electromagnets surrounding said reaction chamber; and
a plurality of secondary electromagnets, each of said secondary electromagnets being disposed in a nested relation with respect to one of said primary electromagnets;
wherein at least two of said secondary electromagnets are adjacent to each other and are disposed within separate adjacent primary electromagnets.

23. The reactor of claim 22, wherein the reaction chamber comprises a cathode and an anode, and wherein said plurality of primary electromagnets each has a plane of orientation that is orthogonal to the surface of said cathode.

24. A magnetic field-enhanced plasma reactor, comprising:

a reaction chamber adapted to apply a plasma to a substrate; and a first and second set of primary electromagnets having inner and outer perimeters disposed about said reaction chamber, said first set of primary electromagnets being provided with a first adjustable current and said second set of primary electromagnets being provided with a second adjustable current; and a secondary electromagnet nested within the inner perimeter of one of said primary electromagnets;

wherein the reactor is adapted to maintain the ratio $R=I_2/I_1$ during etching within the range $-1<R<1$, wherein $I_1$ is the current provided by the first current source, wherein $I_2$ is the current provided by the second current source, and wherein $I_1>I_2$, and wherein the reaction chamber comprises a cathode and an anode, and wherein said primary electromagnets each has a plane of orientation that is orthogonal to the surface of said cathode.

* * * * *